United States Patent [19]

Walker

[11] Patent Number: 5,889,802
[45] Date of Patent: Mar. 30, 1999

[54] BIAS CONTROLLER AND METHOD

[75] Inventor: Stuart Douglas Walker, Colchester Essex, England

[73] Assignee: Hewlett-Packard Company, Palo Alto, Calif.

[21] Appl. No.: 809,738

[22] PCT Filed: Oct. 23, 1995

[86] PCT No.: PCT/GB95/02499

§ 371 Date: Mar. 27, 1997

§ 102(e) Date: Mar. 27, 1997

[87] PCT Pub. No.: WO96/13083

PCT Pub. Date: May 2, 1996

[30] Foreign Application Priority Data

Oct. 22, 1994 [GB] United Kingdom .................. 9421329

[51] Int. Cl.$^6$ .................................................. H01S 3/10
[52] U.S. Cl. ................... 372/31; 372/29; 372/38
[58] Field of Search ................. 372/38, 26, 31, 372/29

[56] References Cited

U.S. PATENT DOCUMENTS

| | | | |
|---|---|---|---|
| 4,062,632 | 12/1977 | Dixon | 356/72 |
| 4,101,847 | 7/1978 | Albanese | 372/31 |
| 4,344,173 | 8/1982 | Straus | 372/38 |
| 5,020,062 | 5/1991 | Cusak, Jr. et al. | 372/23 |

*Primary Examiner*—James W. Davie

[57] ABSTRACT

A bias controller for a semiconductor laser, for example, a laser having an light output which exhibits a threshold at a threshold value of an input drive current, is disclosed. The bias controller includes a test signal generator arranged to generate a low frequency test signal which is the superposition of a modulated control signal on a DC bias signal which is applied to the laser as a drive current superimposed on a high frequency data signal. A detector is arranged to determine the value of either the third harmonic component, or the second harmonic component, of the light output of the laser. A control means is arranged to control the DC bias current to have a value close to the threshold value by maintaining the detected value of the harmonic component of the light output of the laser near to a predetermined value.

7 Claims, 5 Drawing Sheets

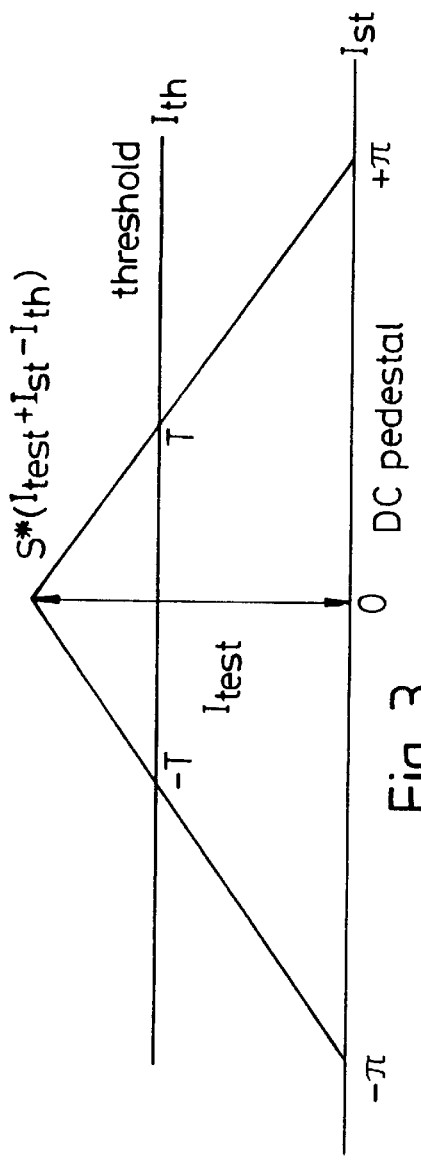
Fig. 3
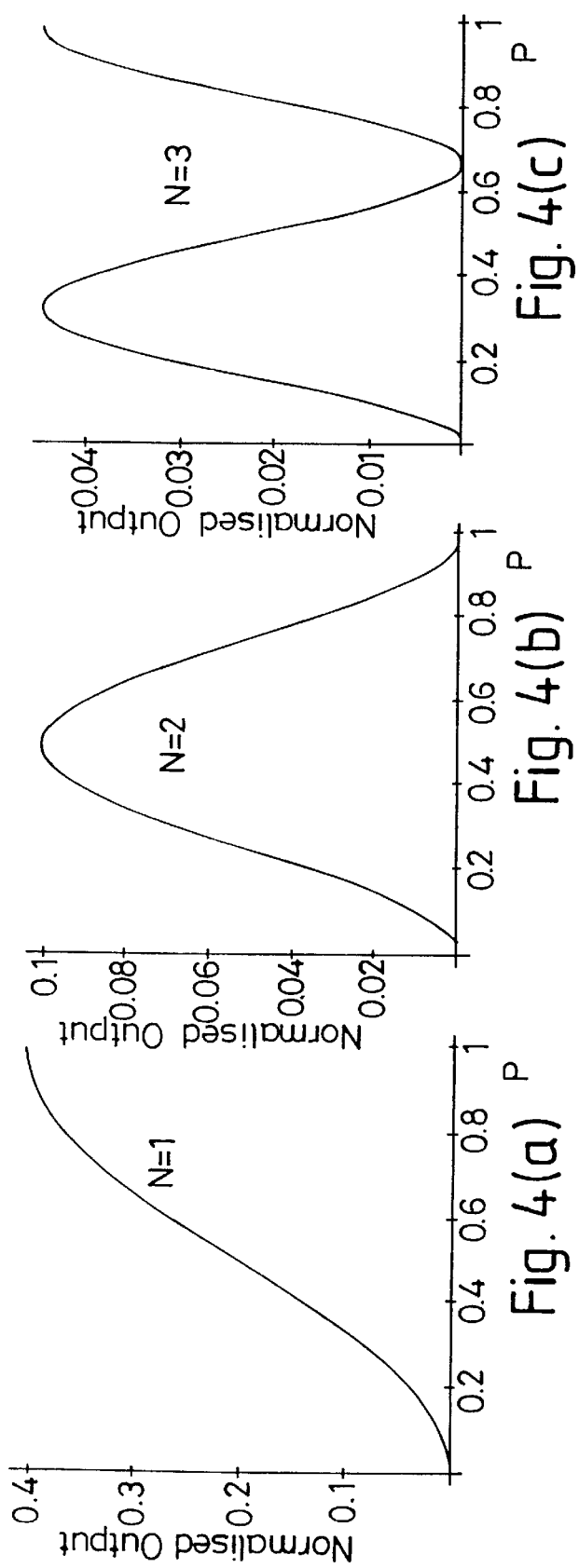
Fig. 4(a)
Fig. 4(b)
Fig. 4(c)

BIAS CONTROLLER AND METHOD

This invention relates to apparatus having an output which exhibits a threshold characteristic as a function of an input signal and in particular to methods of, and apparatus for, controlling the pump signal applied to such apparatus to maintain the pump signal near the threshold value.

Particular examples of such apparatus are semiconductor and optical fibre lasers in which cases the pump signal is the DC bias current and optical pump signal, respectively.

A semiconductor laser, for example, has a light output (L)/current (I) transfer characteristic having a threshold level region as shown in FIG. 1, the threshold "knee" 2 of which is shown enlarged in FIG. 2. In a digital data transmission system, for example, the laser is operated by superimposing a data pulse current on a D bias current, which combined current is used as the drive current for the laser as shown in FIG. 1.

The value of the DC bias current is ideally located near the knee of the transfer characteristic to reduce the extinction ratio penalty and switch-on delay. Whilst careful manual adjustment of the DC bias current may be acceptable in a laboratory it is necessary to provide automatic control of the bias current level for OEM and turnkey equipment.

One well known approach to providing such automatic control, which has the attraction of being simple to implement, is to control the D bias current so the mean-power output of the laser is maintained at a constant value. The mean power level is set so that the zero data level is at the knee region of the threshold region. However, this system can only maintain correct operation close to the temperature at which the control system was set up. As the temperature varies up and down so the threshold region moves to higher and lower values of drive current. The threshold also moves as the device ages.

This lateral shift of the transfer characteristic can be automatically tracked by the mean power controller. However, as the temperature variation from that at set-up gets bigger, so does the variation in laser slope efficiency of the laser. When the slope efficiency increases, as the temperature decreases, the D bias current will be reduced relative to the position of the threshold knee by the bias controller to maintain the same mean power output from the laser. This results in a turn-on delay being introduced into the system. When, on the other hand, the slope efficiency decreases as the temperature increases, the bias signal will be increased relative to the threshold knee by the bias controller to maintain the same mean power output from the laser. This results in increase in an extinction ratio penalty of the system.

In an effort to overcome the problems of the mean-power control method, control methods have been devised which are based on detection of the threshold of the transfer characteristic with the D bias current controlled to be close to this point. A second, independent, control circuit ensures the data signal amplitude is such that the mean power output remains constant despite any changes of laser slope efficiency with temperature.

Various approaches have been taken to effect detection of the threshold signal. In one method, a measurement is made of the switch-on delay of the laser the value of which is used to set the D bias current appropriately. This technique requires the use of a high-speed feedback photodiode and associated high frequency amplifier circuitry in the bias control circuit.

In a further method described in an article titled "An Automatic Bias Control (ABC) Circuit for Injection Lasers" by A Albonese, The Bell System Technical Journal Vol. 57, No. 5, May-June 1978, pages 1533 to 1544, a totally electronic method of stabilizing the laser is disclosed in which the threshold is detected by means of a feedback signal derived from the laser voltage. The laser junction voltage is monitored and an error signal proportional to the degree the laser junction is not saturated is derived and the laser D bias current is adjusted until the junction voltage is saturated. This method depends for its satisfactory operation on a correlation between the electrical properties of the laser and the optical threshold of the laser.

An article titled "Laser Level-Control Circuit for High-Bit-Rate Systems using a Slope Detector" by D. W. Smith, Electronics Letters, 23rd November, 1978, Vol. 14 No. 24, pages 775–776, discloses a bias control method which detects the change of slope of the optical output/injection current transfer characteristic at threshold and sets the DC bias current accordingly which avoids the use of a fast photodiode, wide band amplifiers and does not rely on the electrical properties of the laser.

In this method a small amplitude, low frequency, square wave modulated signal is added to the DC bias current and the consequential variation in the laser light output detected by a slow feedback photodiode. A diode gate is employed to ensure the modulated signal is only applied for 0 data signal levels. The amplitude of the low frequency light output emitted by the laser is proportional to the slope of the threshold knee at the bias signal value. Thus, as the DC bias signal increases from a value below threshold to one that is above threshold the amplitude of the low frequency output signal increases.

A control signal is obtained by rectifying the low frequency AC output from the photodiode to obtain a voltage indicative of the position of the DC bias current relative to the threshold knee which can be maintained in the same relative position by means of a feedback control circuit which compares the control signal to maintain it equal to a preset reference value.

This technique requires the laser slope efficiency to vary with injected current which is the case for most practical semiconductor laser devices.

There are various disadvantages associated with this technique, however. High frequency circuitry is required to provide the gating function which ensures the modulated signal is not applied to the high level data signals, which circuitry must be isolated from the low-frequency control system. As mentioned in the above referenced article by D. W. Smith, a large value of the second derivative of the light current transfer characteristic ($dL^2/d^2I$) is required to reduce the effect of the circuit tolerances which must remain positive to ensure only negative control feedback is present. However, there are commercially available lasers in which this second derivative can go negative.

Further, reductions in the slope efficiency with increasing temperature cause the bias signal to move to a higher value, for a fixed reference voltage, so a deterioration in the extinction ratio with increasing temperature is to be expected. Also, if the gain is insufficient at some temperature the laser will be driven to destruction.

According to a first aspect of the present invention there is provided a method of biasing an apparatus having an output which exhibits a threshold at a threshold value of an input signal, the method comprising the steps of:

superimposing a modulated signal having a fundamental frequency on a pump signal to form a test signal;

applying the test signal as an input signal; and controlling the pump signal to have a value close to the threshold value by maintaining a characteristic of the output of the apparatus close to a predetermined value; characterised in that:

the characteristic of the output is the value of a selected harmonic component of the output, the selected harmonic component having a frequency greater than the fundamental frequency.

An harmonic component of the output having a frequency greater than the fundamental frequency provides a control signal which can be used to maintain the bias signal in the region of threshold knee. If the data signal is high there is no harmonic component so the control function is neutral. The bias control circuit is, therefore, data independent so obviating the need for a diode gate.

Preferably the modulated control signal is selected such that the harmonic component is an antisymmetric function of the value of the pump signal with a single zero crossing point between those two values of pump signal at which the lowest value and highest value of the test signal, respectively, equals the threshold value of the input; and the pump signal is controlled to maintain the harmonic component near zero. In this case because a zero-crossing is sensed, this method of bias control is immune to gain variations and is independent of the slope characteristics at threshold.

In a preferred embodiment of the invention the harmonic component is the third harmonic and the modulated signal comprises a repetition of a combination of a first triangular waveform signal at the fundamental frequency and a second triangular waveform signal at a frequency equal to the third harmonic of the fundamental frequency.

The first and second signals may, for example, have equal amplitudes and be combined serially, with the first signal being present nine times as long as the second signal, on a time-average.

The value of the harmonic component of the output may be detected by means of a phase sensitive detector the output of which is integrated to provide a value representative of the value of the harmonic component of the output.

Alternatively, rather than utilising a harmonic component having an antisymmetric function, one having a symmetric function of the value of the pump signal may be employed. It has been found that such a harmonic component is effective for use with apparatus exhibiting a non-distinct threshold.

In a preferred embodiment of this aspect of the invention, the harmonic is the second harmonic.

A particular application of the method of the present invention is to semiconductor and optical fibre lasers in this cases the pump signal is the laser DC bias current and optical pump signal, respectively.

According to a second aspect of the present invention, there is provided a bias controller for an apparatus (23) having an output which exhibits a threshold at a threshold value of an input signal, the controller including:

a test signal generator arranged to generate a test signal which is the superposition of a modulated control signal having a fundamental frequency on a pump signal for application to the apparatus (23) as an input signal;

a detector (36,38,46) arranged to determine the value of a characteristic of the output of the apparatus (23); and control means (50) arranged to control the DC bias signal to have a value close to the threshold value by maintaining the value of the characteristic of the output of the apparatus (23) close to a predetermined value; characterised in that:

the detector (36,38,46) is arranged to determine the value of a selected harmonic component of the output, the selected harmonic component having a frequency greater than the fundamental frequency.

The bias controller of the present invention may be used to control the bias current of a semiconductor laser system, for example, in which case the bias controller is arranged to control the laser DC bias current.

Such a semiconductor laser system may include:

a first square wave generator arranged to generate a first series of square wave signals;

a second square wave generator arranged to generate a second series of square wave signals having one third the frequency of, and in quadrature with, the first series of square wave signals;

switch means arranged to couple the first and second series of square wave pulses alternately to the input of an integrating means the output of which comprises a series of triangular waveforms of a frequency equal to the frequencies of the first and second square wave signals, respectively, having the same amplitude and in which the first signal is present nine times as long as the second signal.

The switch means of such a semiconductor laser system conveniently comprises: a divide-by-N circuit coupled to the output of the second square wave generator; a decade counter having an input coupled to the output of the divide-by-N circuit; the output of the decade counter being coupled to gate means arranged to gate the first and the second series of square wave signals alternately to the input of the integrator means for respective time periods having the ratio 9:1.

Embodiments of the present invention will now be described, by way of example only, with reference to the accompanying drawings, in which:

FIG. 3 is a graph of a triangular test signal applied to the threshold region of a semiconductor laser;

Figure 5:
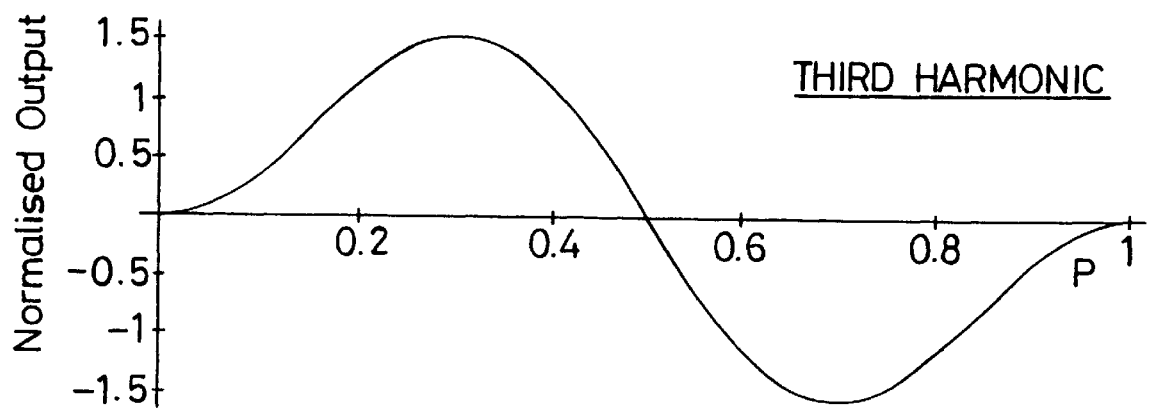
Figure 7:
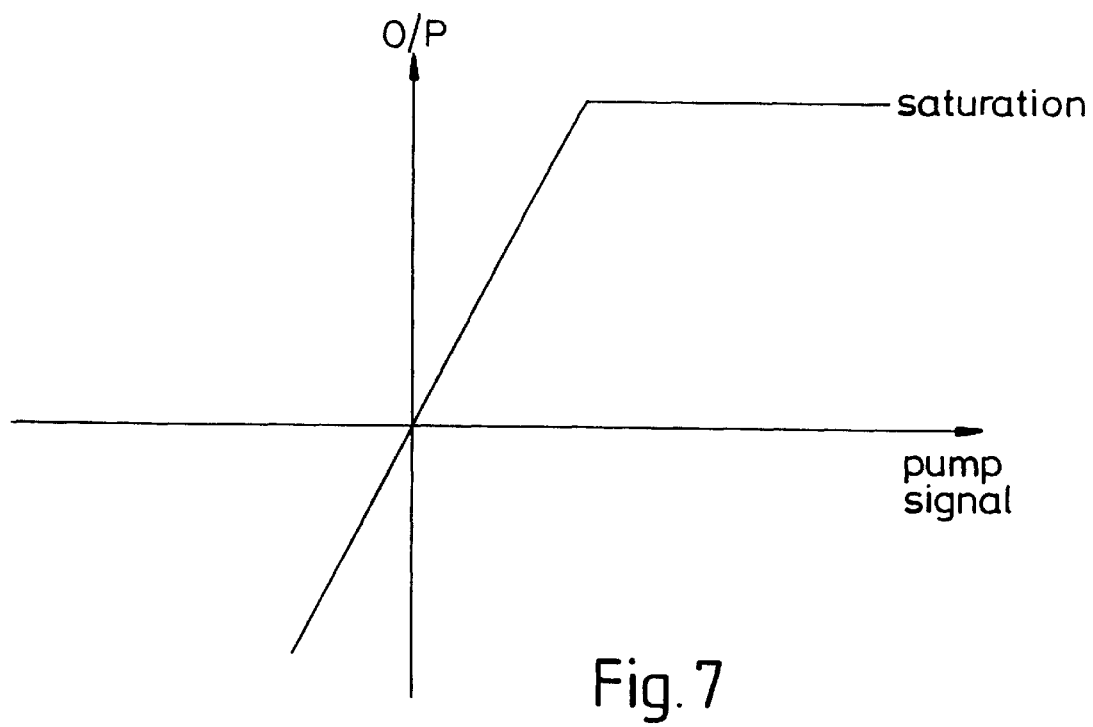
Figure 6:
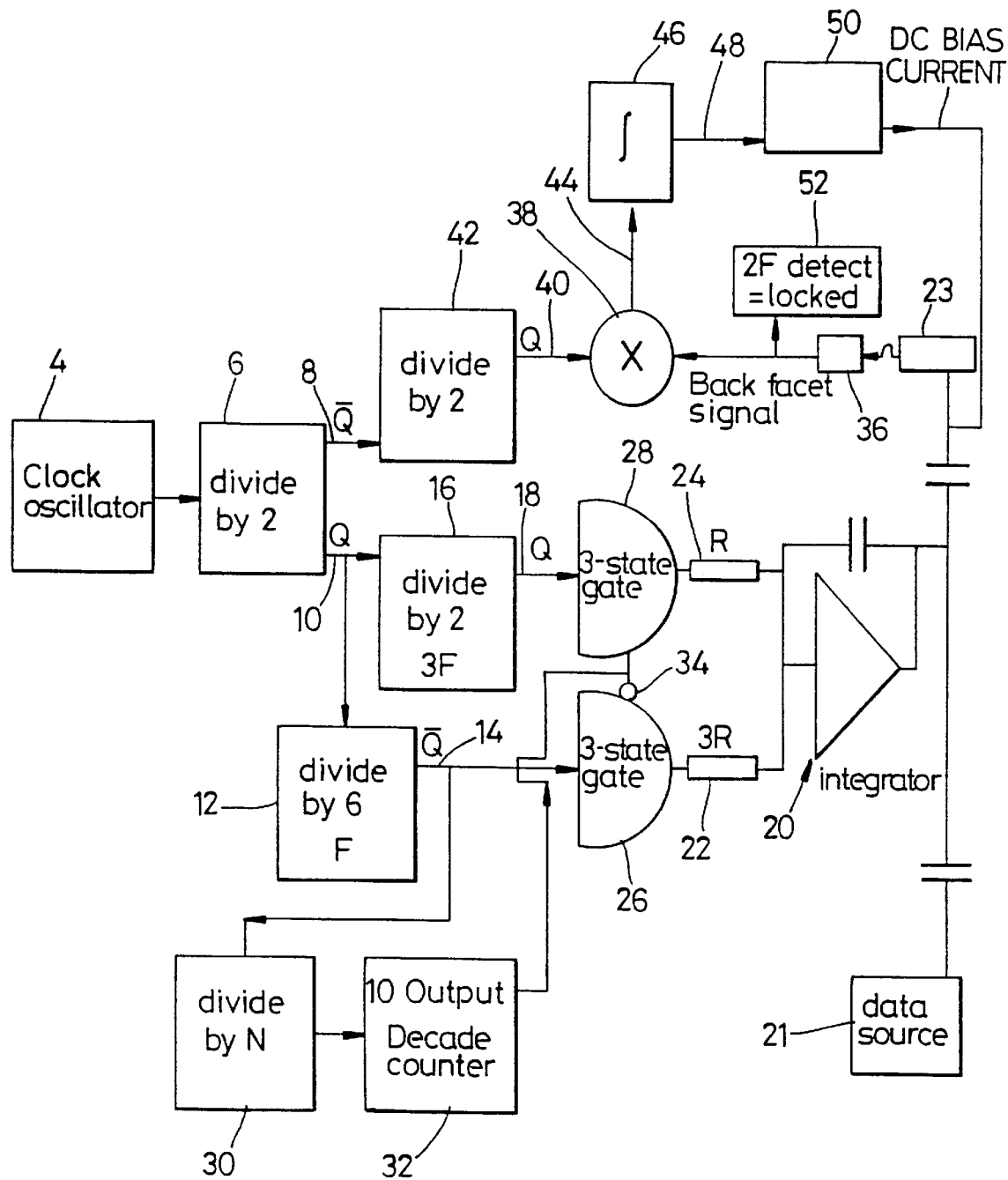
Figure 8:
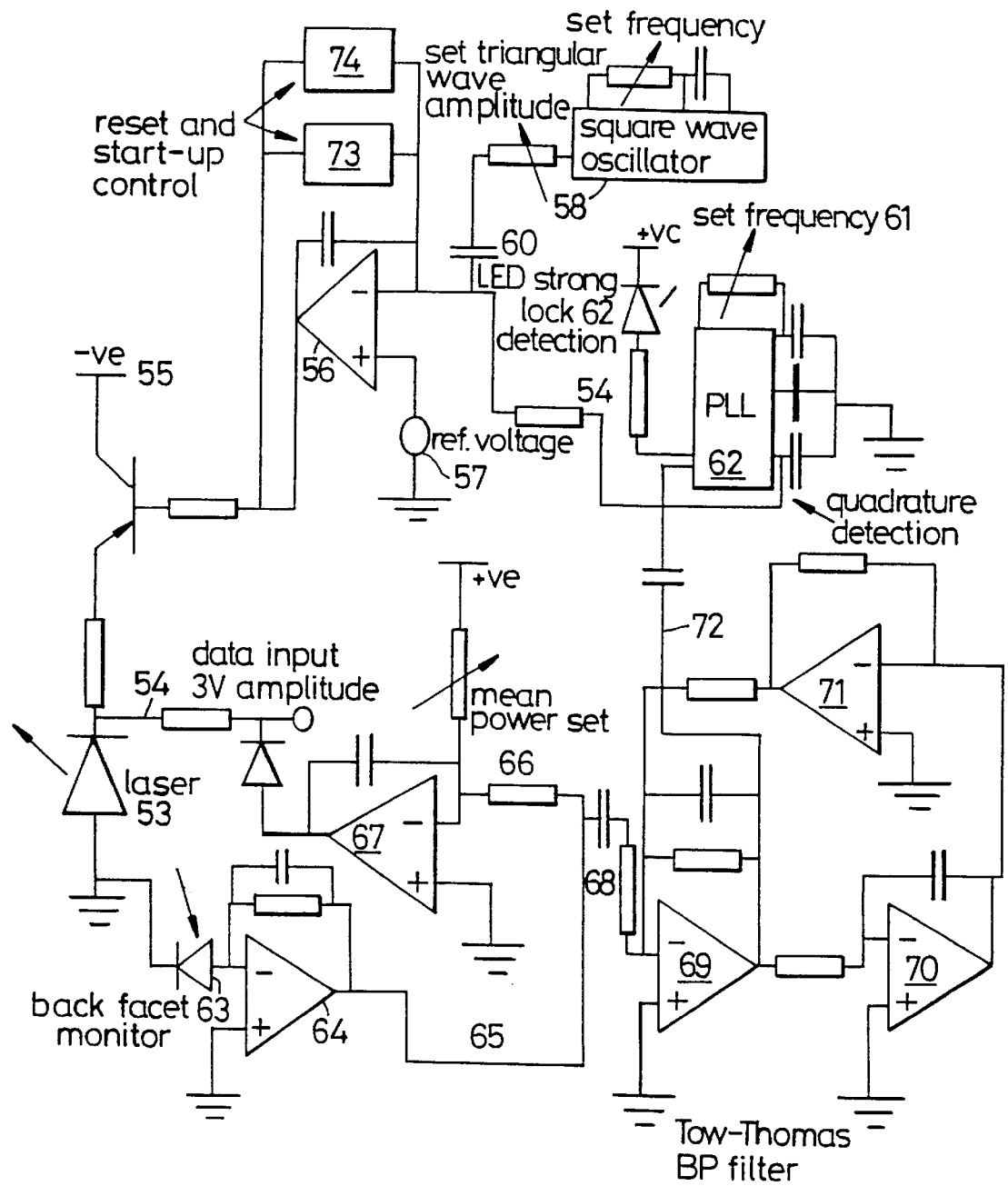

FIGS. 4(a) to 4(c) are graphs of harmonic components of the output generated by a triangular test signal;

FIG. 5 is a graph of the normalised, third harmonic component of the output of a semiconductor laser controlled by a bias controller according to a first embodiment of the present invention;

FIG. 6 is schematic diagram of a bias controller according to a first embodiment of the present invention; and FIG. 7 is a graph of the threshold knee region 2 of the onset of saturation characteristic of an optical fibre laser, and FIG. 8 is a schematic diagram of a bias controller according to a second embodiment of the present invention.

Consider first a semiconductor laser driven by a modulated test current having a triangular waveform of zero-to-peak amplitude of $I_{teat}$ on a DC bias current $I_{st}$, then the light output from the laser will be approximately as modelled as in FIG. 3. If the drive current at threshold is denoted $I_{th}$ and the laser slope efficiency S, the light output is to a first approximation given by the expression $$O/P = S^*(I_{test} + I_{st} - I_{th})$$

Lasing action starts and stops at the threshold crossing time ±T. The period of the triangular wave is generalised to $2\pi$ and its frequency is assumed to be much less than that of the data. The prospect of "mimicking" will be reduced by making the response time of the control system relatively long so that significant persistence of the mimick signal is required.

The light output from the laser is amenable to standard Fourier analysis. One must first identify a signal which varies with the laser bias relative to the threshold. If we define the falling part of the triangular wave by the function F(x), given by:

$$F(x) = I_{test} * (\pi - x)/\pi + I_{st} \qquad 1$$

then the point of the threshold crossing when x=T is defined by:

$$I_{st} + I_{test} * (\pi - T)/\pi = I_{th} \qquad 2$$

after some rearrangement, we get:

$$T = \pi/I_{test} \cdot [I_{test} - I_{test} - I_{test}] \qquad 3$$

Figure 1:
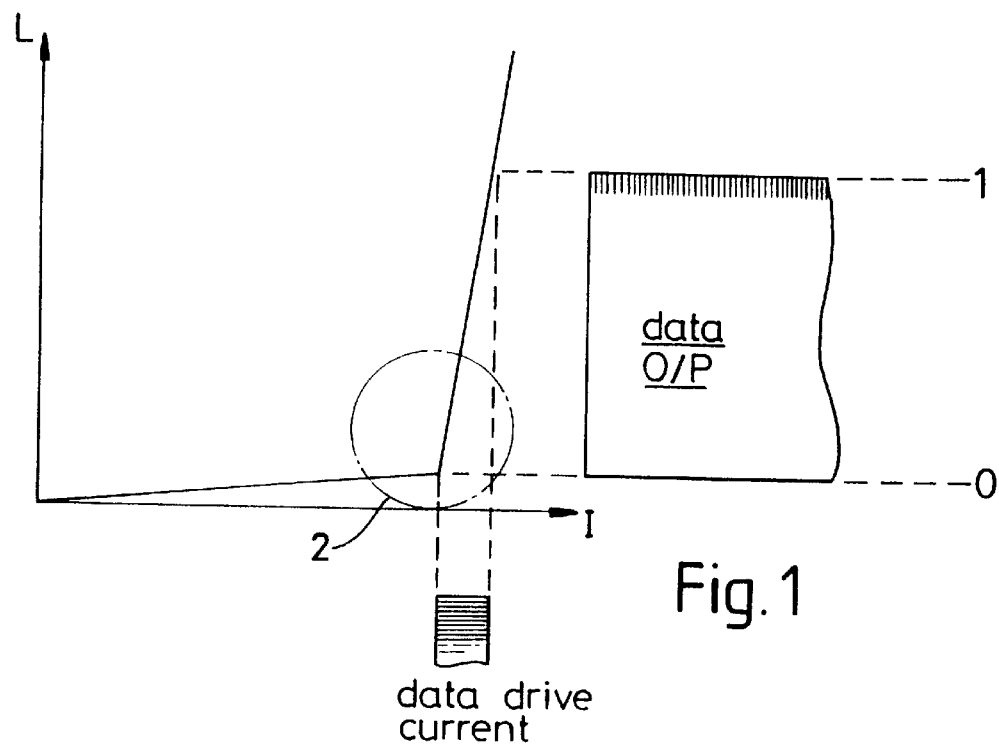
FIG. 1 is a graph of the light output (L)/injection current (I) transfer characteristic of a semiconductor laser.
Figure 2:
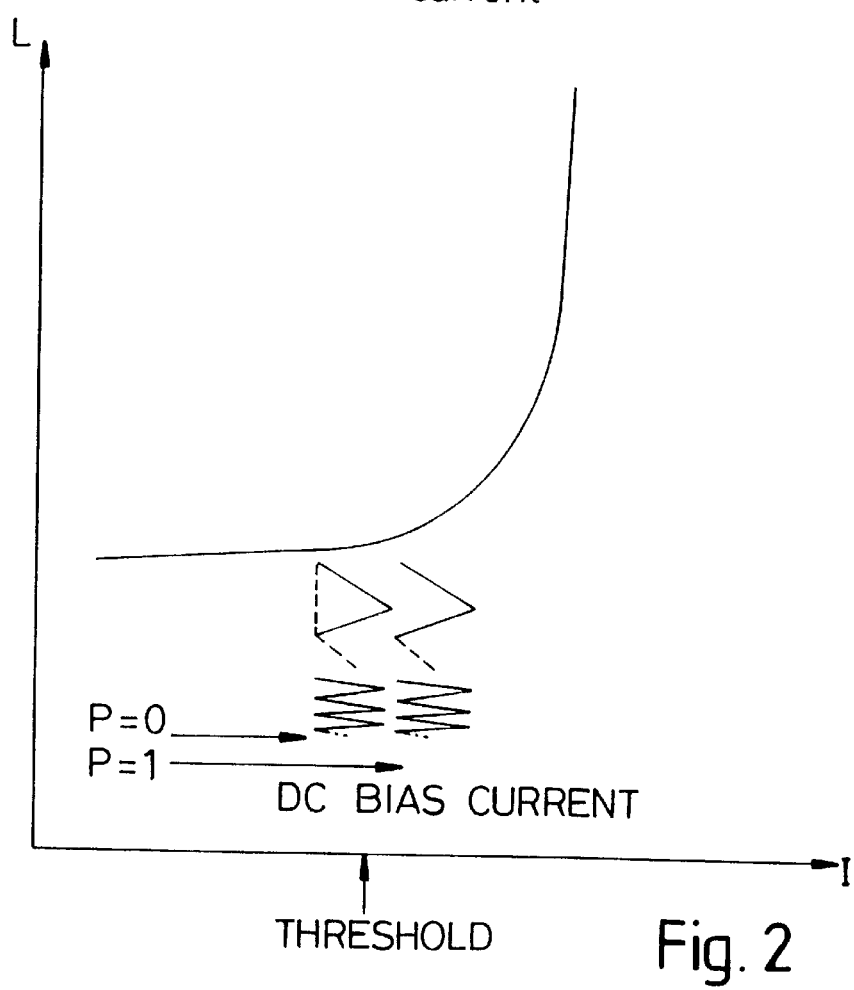
FIG. 2 is a graph of the threshold knee region 2 of the transfer characteristic curve of FIG. 1.

On inspection, we note that no lasing light output is present when $I_{test} + I_{st} = I_{th}$ ($I_{th} - I_{st} = I_{test}$) and that continuous output is provided when $I_{th} = I_{st}$ ($I_{th} - I_{st} = 0$). We can then define ($I_{th} - I_{st}$) by a parameter $K*I_{test}$ $0 \leq K \leq 1$. Using this parameter, $T = \pi[1-K]$ and, noting the range of K substitute $P = 1-K$, we have:

$$T = \pi P \qquad 4$$

where P=1 or 0 represents continuous or zero laser light output, respectively. This is illustrated at FIG. 2.

Noting the even symmetry chosen, the Fourier terms for the Nth harmonic of the light output, $L_N$, are given by:

$$L_N = \frac{2S}{\pi} \int_0^T \left[ I_{st} + I_{test} \times \frac{(\pi - x)}{\pi} - I_{th} \right] \cos(Nx) dx \qquad 5$$

With rearrangement, this becomes:

$$L_N = \frac{2S}{\pi} I_{test} \int_0^T (\pi P - T) \cos(Nx) dx \qquad 6$$

On substitution of $Q = T/(\pi P)$, we get:

$$L_N = 2S \cdot P^2 I_{test} \int_0^1 (1 - Q) \cos(N \pi Q) dQ \qquad 7$$

The expression of equation 7 is a standard integral and $L_N$ is given by:

$$L_N = 2S \cdot I_{test} \frac{[1 - \cos(N\pi P)]}{(N\pi)^2} \qquad 8$$

The behaviour of this function with respect to P when normalised to $S.I_{test}$ for N=1, 2 and 3 is shown in FIG. 4a to 4c.

It can be seen that a control characteristic is produced in that the first, second and third harmonic output vary directly with P. There is no second harmonic in the triangular wave input so the N=2 output reaches a maximum when P=0.5. All the curves are directly dependent on the laser slope efficiency.

From the performance graphs of a typical commercially available semiconductor laser, it was found that the slope efficiency decreases with increasing light output with the most pronounced effect present at 85° C. This can be modelled by introducing a second order effect $S_2$ into expression 7. We then have:

$$L_N = 2 \cdot P^2 I_{Test} \int_0^1 S \cdot (1 - Q) + I_{test} S^2 P (1 - Q)^2 \cos(N\pi Q) dQ \qquad 9$$

to give $$L_N = \frac{1}{(N\pi)^2} I_{test} \left[ S\{1 - \cos(N\Pi P)\} + 2 I_{test} S_2 \left\{ P - \frac{\sin(N\pi P)}{N\pi} \right\} \right] \qquad 10$$

Bearing in mind that $I_{test}$ and $S_2$ are likely to be small, the effect of the second order term is relatively unimportant. From the data supplied, $S_2$ is approximately $-0.042$ W/A² in the lasing region at 85° C. whilst $I_{test} \leq 5$ mA, so $2I_{test}S_2 = 4.2 \times 10^{-4}$. As S is $1,516 \times 10^{-2}$, the second order effect is just 2.8% of the first-order characteristic.

A control system can be based on the curves in FIGS. 4a to 4c, and in accordance with a second embodiment of the present invention such a system based on the curve of FIG. 4b will later be described.

However, one can also, in accordance with a first embodiment of the present invention, combine various repetition rate triangular waves in weighted form to obtain composite characteristics. A particularly preferred combination is a triangular wave a repetition rate $F_1$ defined as $T_1$ (t) combined with a second inverted triangular wave at repetition rate $3*F_1$ and ⅓ the duration, which is defined as $T_2(t)$. Referring to expression 8, this gives the third harmonic component a P dependence of the form:

$$L_N = \frac{2S}{(3\pi)^2} I_{test}[\cos(\pi P) - \cos(3\pi P)] \qquad 11$$

This function (normalised to $2S.I_{test}/(3 \pi)^2$) is plotted in FIG. 5. A useful property is that a central zero crossing is present. This provides a control function which is independent of the laser slope. This is an unmodulated response and shows that the laser will automatically be brought to the P=0.5 point by a standard servo-type feedback. When binary data is applied, the laser will spend a proportion $D_1$ ($0 \leq D_1 \leq 1$) of its time in the low bias condition with the characteristic P=0.5 of FIG. 5 and proportion $(1-D_1)$ in the P=1 region when the output is zero. The zero crossing is therefore unaffected so the bias is both data and slope independent.

Control of the modulation drive pulse can be essentially independent of the threshold setup procedure as the DC mean power output signal has not been used. The drive pulse amplitude may be adjusted to maintain a constant mean power output.

P is the threshold position indicator with P>1 showing bias greater than threshold. As previously mentioned, this control characteristic removes the need for a diode gate because a null output is obtained above threshold. Additionally, a zero-crossing is sensed which makes the control system immune to gain variations. In operation, a triangular wave of repetition rate $F_1$ and peak-to-peak amplitude $I_{test}$ is added to the standing DC bias current. The third harmonic output is detected and integrated. This signal is followed by an inverted triangular wave with repetition rate $3 \times F_1$ which is applied for ⅓ the duration of the lower rate triangular wave. The fundamental of this signal (which is equivalent to the third harmonic of the $F_1$ repetition rate signal) is detected and integrated as before. The integrated voltage is used to control the laser bias current.

If it is assumed that, in the threshold region, P is proportional to $$\int L_N dt$$

where $L_N$ is given by equation 11 above, then:

$$P = H\int L_N dt = H \cdot \frac{2S}{(3\pi)^2} \cdot I_{test}[\cos(\pi P) - \cos(3\pi P)] dt \quad 12$$

where H is a constant of proportionality.

As before, we note that the integral in equation 12 is indefinite, so the long-term condition is that $[\cos(\pi P) - \cos(3\pi P)] = 0$. This result is independent of any circuit parameters.

As it stands, the control system only operates if the bias current is brought near the threshold region. Below threshold, there is no control signal (apart from offset voltages) so the laser will remain in the "off" condition. Adding a continuous offset voltage to the integrator input will introduce dependence on circuit parameters. One solution is to provide a one-shot startup voltage which brings the laser to the threshold region but is then defeated by much larger control signals from the test signals. Once the one-shot has elapsed, there will be no intrinsic offset. It may also be possible to provide digital or delta-sigma type integration control.

When the laser bias is controlled by an integrator scheme, there are two contributions to power level variation. The first contribution is the test signal itself. At equilibrium, there will be an eye closure equivalent to $I_{test}$. This arises from signal current modulation by $I_{test}/2$ at the top and bottom of the eye diagram. A second contribution stems from the integrator control action. Inspection of equation 12 shows that for small H<<1, the peak-to-peak integrator-generated swing, $\Delta P$, will be approximately:

$$\Delta P = \frac{8 \cdot H \cdot 2S}{(3\pi)^2} \cdot I_{test} \quad 13$$

where a 1:9 time duration ratio for the test signals has been assumed. As may be seen, this accounts for the factor of 8 in equation 13. If the integrator output voltage causes a laser bias change of 1mA/V and 1 mA we know that $0 \leq P \leq 1$ is equivalent to a bias current variation for 0 to 1 mA.

Assuming that the harmonic output of the back facet photodiode detector (with responsivity taken as 1 A/W) is passed through a preamplifier with $10^6$ V/A transimpedance, that the phase-sensitive detector has unit voltage transfer function and that the ratio of the duration for which the higher repetition rate test signal is applied to the integrator time scaling factor is one, then $\Delta P$ is $3.413 \times 10^{-4}$.S has been taken as $1.5161 \times 10^{-2}$ W/A at 85° C. as before. Further evaluation, shows that $\Delta P$ can be as large as $10^{-2}$ before the approximate relationship in equation 13 breaks down. Thus a factor of approximately 30 times greater loop gain can be employed. Other loop transfer parameters may be readily incorporated as a simple product relationship applies. Overall, the presence of $I_{test}$ is the main cause of eye closure.

A basic simulation of the control loop has been carried out using Mathematica. With a starting $\Delta P$ of 0.1, 15 cycles of the test loop were required with a loop transfer function of $10^{-2}$. This increases in proportion to loop parameters which affect the settling time, we can see that this time will reduce to 72% of the 85° C. figure at −40° C. In all cases, the correct operating point at P=0.5 is found. No loop instability is expected, as the presence of an integrator sets the dominant pole at DC.

Referring now to FIG. 6, a bias controller according to the present invention derives a modulated signal for superposition on a laser DC bias current from a clock oscillator 4 driven at about 1 kHz. A divided-by-2 circuit 6 generates from the clock signal a first and second output, 8 and 10, which are in quadrature to avoid any mark-space ratio problems that might be associated with the clock 4.

The second output 10 from the divide-by-2 circuit 6 is used to generate two square-wave waveforms, the first at a fundamental frequency, F, the second at a frequency which is three times the fundamental frequency, 3×F. The first square-wave waveform is generated from the second output 10 by a divide-by-6 circuit 12 at its output 14: the second waveform is generated from the output 10 by a divide-by-2 circuit 16 at its output 18. The outputs 14 and 18 are in quadrature.

The first and second waveforms are gated to the input of an integrator 20 by a pair of 3-state gates 26 and 28 via respective resistors 22 and 24, the former resistor having three times the resistance of the latter to equalise the amplitudes of the two triangular waveforms.

The waveforms are gated so the first and second waveforms are applied alternately to the integrator 20, the former for 9 times the duration of the latter. This is achieved by a divide-by-N circuit 30 and a decade counter connected in series between the output 14 of the divide-by-6 circuit 12 and the gate inputs of the 3-state gates 26 and 28, the former being connected via an inverter 34. The value of N is not critical and a suitable value, for example 64, for effective control loop gain can be readily determined by trial and error.

The output of the integrator 20 is superimposed on a DC bias current to form the test signal to be applied, together with the data current from a data current source 21, to a semiconductor laser 23.

A portion of the optical output of the laser is detected by a back facet diode 36 whose output is coupled to a phase sensitive detector 38, for example a Gilbert cell or an analogue equivalent in ex-or gates.

The third harmonic of the back facet signal, relative to the fundamental frequency defined by the first triangular waveform, is detected by virtue of a reference signal 40 obtained from the output 8 of the divide-by-2 circuit 6 by a further divide-by-2 circuit 42.

The output 44 of the phase-sensitive detector 38 is input to an integrator 46 whose output 48 is a measure of the third harmonic content of the laser output signal. This signal is coupled to a conventional feedback control circuit indicated schematically as box 50 arranged to control the DC bias current so as to maintain the third harmonic component of the laser output close to zero.

It will be seen from FIG. 4(b) that at P=0.5 the second harmonic component of the light output from the laser reaches a maximum. One can therefore detect the value of the second harmonic component by a lock detector 52 to determine when successful lock-on to the threshold point has been achieved.

The laser system of FIG. 6 is not self-starting but this can be readily achieved by including a further current generator which ramps or steps upwards on start-up until a predetermined value of the second harmonic component of the laser output is detected. This further start-up current ramp can then be removed. The presence of the second harmonic component indicates the test signal is at least part above threshold whereupon the bias controller will be effective to move the DC bias current to the desired value such that P=0.5.

The clock 4 should be chosen to have a low frequency to avoid data interference in the control loop but this must be balanced against the need to track rapid temperature changes.

It will be appreciated that the laser output produced by the test signal is not exactly triangular but will be more of a cusp shape due to the non-linear nature of the threshold knee. However, the more cusp-like optical waveform still has a third harmonic component which will result in some asymmetry in the graph of FIG. 5 but which will still have the required characteristics for the control method and apparatus of the present invention. Similarly, other test signal wave forms may be devised which produce the required harmonic component characteristics of the present invention in the output of the apparatus whose bias is being controlled.

Although the first embodiment of the present invention, based on the use of the third harmonic signal shown in FIG. 4(c), has many advantages, it has been found that this technique works best for apparatus which exhibit a sharp threshold characteristic. For some apparatus which exhibit a non-distinct threshold for example for a semi-conductor laser having a smooth curve between a non-lasing part of the output characteristic and a lasing part of the output characteristic, it has been found that use of a control signal which incorporates a third harmonic component is not effective. The reason for this is thought to be that the amount of third harmonic component present at the threshold area, for apparatus having such a non-distinct threshold, is small.

A second embodiment of the present invention will now be described which utilises a second harmonic component, as shown in FIG. 4(b). This curve shows the second harmonic variation which takes place when a triangular wave modulating signal is operated on by a device exhibiting a threshold characteristic. When P=0, all the triangular wave is below the threshold and when P=1, all the triangular wave is above. The amount of second harmonic signal detected increases as soon as the threshold region is reached. If the device is modulated by a data signal, then a high level data signal will drive the device beyond the P=1 region where no second harmonic signal is produced. This feature means that the technique of the second embodiment also intrinsically ignores the effect of a superimposed data signal. In consequence, no high-speed data gating circuitry is required and the ultimate modulation bandwidth depends on the device and associated drive circuitry. The technique of the second embodiment is not restricted to the use of triangular waves. Any waveform which has no second harmonic content and which shows second harmonic content when operated on by a thresholding device may be suitable. Examples are a sinewave, symmetric sawtooth and cusp waveforms.

The functional features of a bias controller for a semiconductor laser which utilises a triangular wave signal will now be described. When the triangular wave is below threshold, a DC bias signal, for example from the output of an integrator with a very much longer time constant than a data bit, increases until the threshold region is reached. When a second harmonic signal is detected the bias signal is reduced by negative feedback until an equilibrium point is found and the system stabilises. If the laser threshold changes, the control loop will keep an equilibrium condition. If the laser is biased above threshold by a data signal, the control signal will change only very slowly such that control will be resumed when the device is in the threshold region again. Ancillary circuits of conventional form such as Schmitt triggers may be used to bring the thresholding device quickly upto threshold at switch on and to provide a reset function should control not be obtained even at the maximum second harmonic signal output when P=0.5.

Thus in summary, a triangular wave at frequency F is applied continuously and the second harmonic at 2*F is detected. The amplitude of this signal is compared to a finite reference voltage and the difference used to control the feedback.

Referring now to FIG. 8, the laser 53 has a current input from the data input path 54 and also from the controller via the PNP Si transistor 55. Considering only this control signal, it is shown as being derived from the integrator op-amp 56. The integrator input consists of three signals. A DC reference 57 against which are compared a symmetrical square wave at frequency F 58 and the second-harmonic level detection output 54 of a phase-locked-loop (PLL). This latter signal has a varying DC level. A DC block circuit 60 prevents any offset voltage being introduced by the squarewave generator 58. The action of the integrator 56 transforms this squarewave to the triangular test signal described earlier and also produces a positive or negative ramp voltage depending on whether the PLL output is above or below the DC reference voltage 57. The PLL output becomes more negative (less positive) when the second harmonic amplitude increases so the laser bias then tends to decease. This negative feedback action provides the closed loop laser bias control. The PLL frequency is set at 2*F by a preset 61, which is not critical as the PLL can have a large lock range. When the second harmonic signal reaches a certain value, a switching circuit illuminates an LED 62 if required to show control action.

The input signal to the PLL is derived from the laser back facet monitor photodiode 63. As shown in FIG. 8, one method for converting the back facet diode photocurrent to a useful voltage is to provide a transimpedence circuit with a maximum transimpedance set so that the output doesn't saturate when maximum laser output is present. This is provided by an op-amp stage directly connected to the back facet monitor. The output of this transimpedance stage is separated into AC and DC components by basic circuitry. The DC component 67 is used to control the level of data modulation by means of a mean power controller of standard well-known form. This is realised as an op-amp 67 adjacent to the transimpedance stage. The AC component which contains the second harmonic information is passed to a conventional band-pass filter centred on 2*F and realised here as the Tow-Thomas topology 69,70,71. Other filter designs are available, this form was chosen as it has low component variation sensitivity and is easy to set up. A band-pass filter is desirable to remove unwanted signals outside the 2*F region. The filter also reduces the possibility of data mimicking the control signal as a large Q factor allows the filter output to respond slowly to changes in the 2*F amplitude. The filter stage also provides significant voltage gain as an AC signal is required for control. Drift is therefore not important. The filter and amplified signal at 2*F 72 is finally passed to the PLL, which completes the control loop.

Start-up and reset functions are realised by two Schmitt trigger circuits 73,74 which control the main integrator action. At switch on, it is assumed that the integrator output is not negative enough to pass current into the laser. This output voltage condition is sensed by the first Schmitt trigger 73 which forces the integrator output to move rapidly towards the operating region. This forced action ceases when near the threshold region. From then on the integrator moves at its normal rate to enter the control region. A second Schmitt trigger 74 senses if the laser bias current is in excess of the maximum threshold requirement. Under these circumstances, it is assumed that control has been lost and the integrator is forced back into the switch on region whereupon start up procedures are commenced by the first Schmitt trigger 73.

It will be noted that the overall control system is autonomous and does not require temperature calibration of the laser. It is merely required that lasing action takes place. Indeed, different devices with widely varying thresholds can be accommodated providing the control circuit can supply the appropriate maximum current. At switch on, the start-up circuit pulls the integrator to within the operating region. The control loop takes over, finds the threshold region and holds the laser there even when a data signal is applied. If the threshold varies for any reason, this will be tracked and control maintained. If control is lost, then an automatic reset is carried out. It may be noted that this circuit would also indicate laser failure without requiring a data input. Should no second harmonic signal be detected, the reset/start-up procedure will repeat at regular intervals which could then set an alarm condition.

This embodiment is realised with bipolar supplies for convenience. Only a single supply is required for the control principle to be realised. Alternative forms of second harmonic detection are possible, for example utilising an envelope or phase-sensitive detector. Furthermore, although the configuration shown is analogue in nature, many of the functional blocks may be implemented in digital form.

The present invention may be applied to other apparatus exhibiting the required threshold behaviour of output versus an input signal, for example an optical fibre laser. In this case optical output of an optical pump laser may be controlled via its drive current to maintain the optical fibre laser at the threshold region.

The present invention is also applicable to controlling devices which exhibit a threshold knee analogous to the onset of lasing described above, as for example at the onset of saturation of a laser as shown schematically at FIG. 7. The value of the controlled pump signal at a give moment provides, in this case, an indication of the onset of saturation at the prevailing operating conditions thereby providing an effective apparatus for, and method of, exploring the saturation characteristics of such devices.

I claim:

1. A method of biasing an apparatus having an output which exhibits a threshold at a threshold value of an input signal, the method comprising the steps of:

superimposing a modulated signal having a fundamental frequency on a pump signal to form a test signal, said modulated signal comprising a repetition of a combination of a first triangular waveform signal at the fundamental frequency and a second triangular waveform signal at a frequency equal to a third harmonic of the fundamental frequency;

applying the test signal as an input signal; and controlling the pump signal to have a value close to the threshold value by maintaining the third harmonic component near zero.

2. A method as claimed in claim 1 in which the first and second signals have equal amplitudes and which are combined serially, with the first signal being present nine times as long as the second signal, on a time-average.

3. A method as claimed in claim 1 in which the value of the harmonic component of the output is detected by means of a phase sensitive detector the output of which is integrated to provide a value representative of the value of the harmonic component of the output.

4. A method as claimed in claim 1, in which the apparatus is a semiconductor laser and the pump signal is a laser DC bias current for the laser.

5. A method as claimed in claim 1, in which the apparatus is a optical fibre laser and the pump signal is an optical pump signal for the laser.

6. A semiconductor laser system for controlling a semiconductor laser that is pumped by a DC bias pump signal from a laser pump, said semiconductor laser having an output which exhibits a threshold at a threshold value of an input signal, comprising:

a bias controller including a test signal generator arranged to generate a test signal which is a superposition on said DC pump signal of a modulated control signal, for application to said semiconductor laser as an input signal, the test signal generated by the test signal generator comprising a repetition of a combination of a first triangular waveform signal at a fundamental frequency and a second triangular waveform signal at a frequency equal to a third harmonic of the fundamental frequency, said test signal generator further including a first square wave generator arranged to generate a first series of square wave signals; a second square wave generator arranged to generate a second series of square wave signals having three times the frequency of, and in quadrature with, the first series of square wave signals; switch means arranged to couple the first and second series of square wave pulses alternately to the input of an integrating means, the output of which comprises a series of triangular waveforms of a frequency equal to the frequencies of the first and second square wave signals, respectively, having the same amplitude and in which the first signal is present nine times as long as the second signal;

a detector arranged to determine the value of a characteristic of the output of the semiconductor laser; and control means arranged to control the DC bias pump signal to have a value close to the threshold value by maintaining the value of the characteristic of the output of the semiconductor laser close to zero; and wherein the detector is arranged to determine the value of a selected harmonic component of the output, the selected harmonic component having a frequency greater than the fundamental frequency.

7. A semiconductor laser system as claimed in claim 6, in which the switch means comprises: a divide-by-N circuit coupled to the output of the first square wave generator; a decade counter having an input coupled to the output of the divide-by-N circuit; the output of the decade counter being coupled to gate means arranged to gate the first and the second series of square wave signals alternately to the input of the integrator means or respective time periods having the ratio 9:1.

\* \* \* \* \*